United States Patent
Wu et al.

(10) Patent No.: US 7,446,042 B2
(45) Date of Patent: Nov. 4, 2008

(54) METHOD FOR SILICIDE FORMATION ON SEMICONDUCTOR DEVICES

(75) Inventors: Chii-Ming Wu, Taipei (TW); Shih-Wei Chou, Taipei (TW); Gin Jei Wang, Taipei (TW); Cheng-Tung Lin, Jhudong Township, Hsinchu County (TW); Chih-Wei Chang, Hsin-Chu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 204 days.

(21) Appl. No.: 11/343,648

(22) Filed: Jan. 30, 2006

(65) Prior Publication Data

US 2007/0178696 A1    Aug. 2, 2007

(51) Int. Cl.
*H01L 21/44* (2006.01)

(52) U.S. Cl. .............................. 438/682; 257/E21.164; 257/E21.165

(58) Field of Classification Search .................. 438/682, 438/660, 655; 257/E21.164, E21.165, E21.199
See application file for complete search history.

(56) References Cited

U.S. PATENT DOCUMENTS

| 6,440,851 | B1 * | 8/2002 | Agnello et al. ............... 438/682 |
| 6,627,543 | B1 * | 9/2003 | Cao et al. .................... 438/664 |
| 6,884,736 | B2 | 4/2005 | Wu et al. |
| 2002/0102849 | A1 * | 8/2002 | Yi et al. ...................... 438/682 |
| 2006/0011996 | A1 | 1/2006 | Wu et al. |
| 2007/0059878 | A1 * | 3/2007 | Chang et al. ................. 438/233 |

* cited by examiner

*Primary Examiner*—Caridad M Everhart
(74) *Attorney, Agent, or Firm*—Duane Morris LLP

(57) ABSTRACT

A method for forming nickel silicide includes degassing a semiconductor substrate that includes a silicon surface. After the degassing operation, the substrate is cooled prior to a metal deposition process, during a metal deposition process, or both. The cooling suppresses the temperature of the substrate to a temperature less than the temperature required for the formation of nickel silicide. Nickel diffusion is minimized during the deposition process. After deposition, an annealing process is used to urge the formation of a uniform silicide film. In various embodiments, the metal film may include a binary phase alloy containing nickel and a further element.

20 Claims, 2 Drawing Sheets

METHOD FOR SILICIDE FORMATION ON SEMICONDUCTOR DEVICES

FIELD OF THE INVENTION

The present invention relates, most generally, to semiconductor device fabrication and more particularly, to methods for forming silicided regions in devices such as field effect transistors.

BACKGROUND

In semiconductor devices, the principal way of reducing contact resistance between an interconnect line and a silicon surface such as a polysilicon gate or silicon source/drain regions is by forming a metal silicide atop the polysilicon or silicon surface to be contacted, prior to application of the conductive film used to form the various conductive interconnect lines. Low resistivity and ease of formation are important considerations in selecting the metal silicide material. Presently, common metal silicide materials include but are not limited to $CoSi_2$, $TaSi_2$, and $TiSi_2$. In today's semiconductor fabrication industry, silicides are typically formed by the so called salicide (self-aligned silicide) process. In the salicide process, a thin layer of metal is blanket deposited over the semiconductor substrate, including over exposed silicon surfaces such as source/drain regions, gate electrode regions, and other contact regions. The wafer (i.e., semiconductor substrate) upon which the semiconductor device is being formed, is then subjected to one or more high temperature annealing steps. The annealing process causes the metal to selectively react with the exposed silicon thereby forming a metal silicide, XSi. The process is referred to as a self-aligned silicide process because the silicide layer is formed only where the metal material directly contacts the exposed silicon area. In other areas where the metal film is separated from silicon such as by a dielectric layer, no silicide reaction occurs.

A preferred metal silicide in today's ultra-large scale integration (ULSI) semiconductor fabrication processes, is nickel silicide. Nickel silicide contacts are advantageously used in contacts of reduced dimension in order to provide resistivity reductions and therefore increased device speed, and to take advantage of nickel silicide's low leakage or diffusion characteristics. One shortcoming associated with silicide formation processes in general and in nickel silicide processes in particular, is non-uniformity of the formed silicide. The non-uniformity includes non-uniform thickness of the NiSi and resistivity, $R_s$, deviation across the formed silicide film. A common cause for such non-uniformities is the premature silicidation that undesirably occurs during the nickel deposition process, and prior to the subsequent annealing process designed to form the silicide. This is true when a pure nickel silicide is formed and also true when a binary phase alloy Ni(X)Si is formed. When a binary phase alloy Ni(X)Si is formed, Ni spiking during deposition additionally results in a non-uniform distribution of the alloying additive X, throughout the film. The spiking is due to different diffusivity characteristics of the different atoms in the substrate. Spiking may occur to silicon in a silicon substrate or to substrates such as SiGe, Ge or Si on SOG. Moreover, premature silicidation may occur due to the suppression of the NiSi formation temperature as a result of the plasma-assist phenomena.

Moreover, chemical dry cleaning processes are increasingly being used to remove moisture from substrates. These dry cleaning processes require a subsequent heating operation to drive off the by-products. Such heating operations also cause reaction between Ni and Si to form NiSi, resulting in an uneven NiSi film.

It would therefore be desirable to provide a nickel silicide film or nickel alloy silicide film in which the silicide film is formed by a method in which the thermal budget of Ni deposition is carefully controlled and in which a silicide film with superior uniformity is formed during a subsequent controlled thermal operation designed to form the silicide.

SUMMARY OF THE INVENTION

To address these and other needs, and in view of its purposes, the present invention provides a method for forming a semiconductor device. The method includes providing a semiconductor substrate including at least a silicon surface, heating to evaporate moisture from the silicon surface, then cooling the silicon surface to a temperature below a silicidation temperature required for nickel silicide formation, thereby producing a cooled silicon surface. The method further comprises depositing nickel on the cooled silicon surface in a manner such that NiSi does not form, and further heating to form a silicide including at least Ni and Si.

According to another aspect, the invention provides a method for forming a semiconductor device, the method comprising providing a semiconductor substrate including at least a silicon surface, heating to evaporate moisture from the silicon surface, disposing the semiconductor substrate on a cold chuck in a deposition system and depositing nickel while the semiconductor substrate is disposed on the cold chuck. The cold chuck maintains the semiconductor substrate at a temperature below a temperature required for NiSi formation. The method further provides further heating to form a silicide that includes at least Ni and Si.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The present invention provides a method for forming nickel silicides such as NiSi and Ni(X)Si in a thermally controlled manner such that silicide formation occurs during an annealing process subsequent to the deposition of the nickel or nickel alloy but not during the deposition process itself. The invention provides for suppressing the temperature of the silicon surfaces prior to deposition and/or during deposition of the nickel or nickel alloy film. The method of the invention prevents and minimizes the diffusion of nickel into the silicon substrate and the formation of a $NiSi_x$ layer between the silicon and nickel layer, during the deposition of the nickel layer. After deposition, the silicon layer is relatively pure, the nickel or nickel alloy film formed over the silicon layer is relatively pure and the interface therebetween is relatively smooth and undisturbed. A subsequent annealing process is the dominant step for NiSi or Ni(X)Si formation. With the thermal budget of the Ni deposition controlled to inhibit the formation of an $NiSi_x$ layer, a good NiSi profile is obtained by the subsequent annealing process and superior $R_s$ uniformity and distribution is produced throughout the semiconductor substrate.

Figure 1:
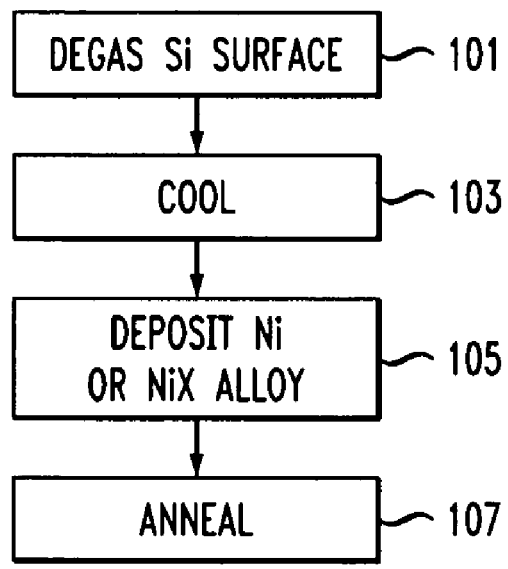
FIG. 1 is a flow chart showing an exemplary process of the invention.

FIG. 1 shows a process flow illustrating one exemplary embodiment of the method of the present invention. At step 101, a semiconductor substrate with at least an exposed silicon surface undergoes a degas operation. The degas operation takes place at an elevated temperature and is used to evaporate moisture from the surface of the semiconductor substrate thereby cleaning the surface. After the degas operation, the cooling operation 103 takes place and lowers the temperature of the semiconductor substrate to a temperature below the temperature required for nickel silicide formation. After the wafer is cooled, nickel or a nickel alloy is deposited at step 105. During the deposition at step 105, nickel or nickel alloy silicidation is suppressed, and minimized. The thickness of any insignificant silicide film formed at this juncture, is advantageously controlled to less than 20Å, and silicidation may be completely prevented in some embodiments. Nickel diffusion and spiking is prevented. After deposition, at step 107, an RTA (rapid thermal annealing) or other annealing process is used to form a silicide film that includes a uniform thickness and uniform resistivity.

According to another exemplary method of the invention shown in FIG. 2, a semiconductor substrate with at least an exposed silicon surface undergoes a degas operation at step 101, and the degas operation is followed by the deposition of nickel or a nickel alloy with the substrate on an electrostatic cooling chuck that maintains the temperature of the substrate including the exposed silicon surface, at a temperature below the temperature required for nickel silicide formation, step 109. During deposition, nickel or nickel alloy silicidation is suppressed, and minimized. The thickness of any insignificant silicide film formed at this juncture, is advantageously controlled to less than 20Å, and silicidation may be completely prevented in some embodiments. Nickel diffusion and spiking is prevented. Subsequent to the deposition process, a rapid thermal annealing process or other annealing process takes place at step 107. Further details of the aforementioned processes appear below.

Figure 2:
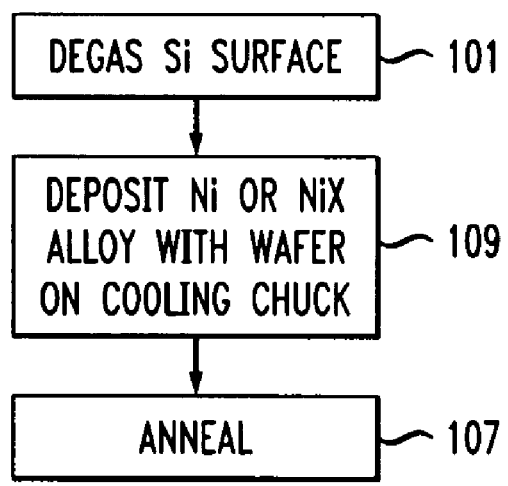
FIG. 2 is a flow chart showing another exemplary process of the invention.

According to another exemplary method of the invention, the embodiments illustrated in FIGS. 1 and 2 are combined and the silicide formation process includes both the cooling operation 103 and the deposition taking place with the use of an electrostatic cooling chuck as in step 109.

Figure 3:
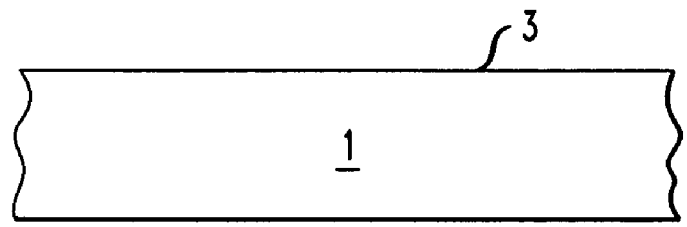
FIGS. 3-5 are cross-sectional views showing a sequence of process operations for forming a nickel silicide film according to the invention.

FIG. 3 is a cross-sectional view showing semiconductor substrate (i.e., wafer) 1 including silicon surface 3. Silicon surface 3 may be a large portion of semiconductor substrate 1 or it may be an isolated portion such as a source/drain region of a transistor, a gate electrode of a transistor, or a contact formed to either a source/drain region, a transistor gate or any of various other structures. Silicon surface 3 may be crystalline silicon such as the substrate itself, a polysilicon material formed over the substrate or an amorphous silicon material formed over the substrate. To most clearly illustrate aspects of the present invention, silicon surface 3 is illustrated as being a surface of semiconductor substrate 1 but such is exemplary only. In another embodiment such as in a salicide process, a plurality of silicon surfaces 3 are laterally isolated from each other by a dielectric material formed over semiconductor substrate 1 and on which a silicide will not form. For such embodiments, after the silicide formation as described below, is carried out to selectively form silicides only in exposed silicon surfaces, the unreacted metal or metal alloy can be removed from the semiconductor substrate.

Prior to the introduction of a metal material, semiconductor substrate 1 and therefore silicon surface 3 undergoes a conventional degassing operation which drives essentially all moisture from silicon surface 3. In one embodiment, the degassing operation may take place at a temperature of about 200° C. for about 20 seconds but in other exemplary embodiments, other temperatures advantageously within the range of 150° C. to 450° C., preferably 180° C. to 220° C., may be used and the operation carried out for times ranging from 10-60 seconds, preferably 15-25 seconds, and chosen to sufficiently drive off moisture. Inert gasses will typically be used and conventional thermal equipment for carrying out such operations is readily available.

According to one exemplary embodiment, the substrate and therefore the silicon surface are then cooled prior to metal deposition. The substrate may be cooled to a temperature below a temperature required for the formation of nickel silicide. For example, the substrate may be cooled to 100° C. or less. In one exemplary embodiment, the temperature may lie within a range of 0° C. to 50° C. and in another embodiment the temperature may be between −50° C. and 0° C. but other temperatures may be used in other exemplary embodiments. Conventional cooling techniques may be used. In one exemplary embodiment, the substrate may be allowed to cool to ambient temperature, preferably in a low atmosphere, moisture-free environment. In one embodiment, air cooling may be used. After semiconductor substrate 1, i.e. the wafer, is cooled, a metal film is deposited on semiconductor substrate 1 including on exposed silicon surface 3. The metal may be nickel, or a binary phase alloy of nickel having a formula NiX where X is an alloy additive selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu, and mixtures thereof. The alloy additive may be present in an amount ranging from about 0.01 to 50 atomic percent but other compositions may be used alternately. Various conventional deposition techniques and systems may be used. Deposition methods include, but are not limited to sputtering, evaporation, PVD (physical vapor deposition), PECVD (plasma enhanced chemical vapor deposition), LPCVD (low pressure chemical vapor deposition) and atomic layer deposition (ALD). In the case of a binary nickel alloy, a PVD target formed of both materials, may advantageously be used to deposit the film using physical vapor deposition techniques.

Figure 4:
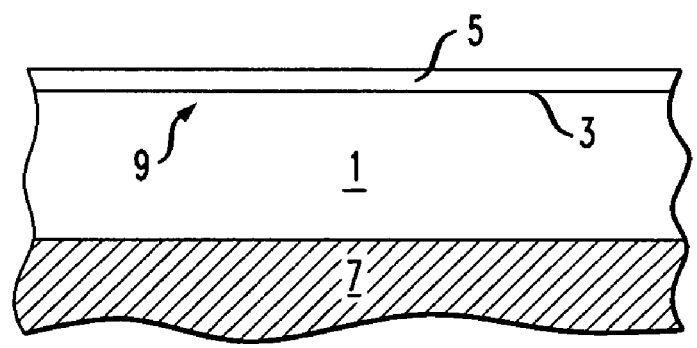

FIG. 4 shows semiconductor substrate 1 after metal film 5 has been formed over silicon surface 3. Metal film 5 may be formed over the entirety of semiconductor substrate 1 and may therefore be formed over multiple instances of exposed silicon surfaces 3 and other structures and films in addition to being formed over silicon surfaces 3. Metal film 5 may be nickel, or a binary phase alloy NiX as described above. Metal film 5 may be formed to various thicknesses, and in one exemplary embodiment, metal film 5 may include a thickness of about 20-300 Å, and more preferably between 50-150 Å, as deposited, but other thicknesses may be used in other exemplary embodiments. In other exemplary embodiments such as full silicidation metal gate applications, the thickness may be within the range of 50-1000 Å, more particularly within the range of 200-500 Å. Due to the low temperature of semiconductor substrate 1 and silicon surface 3 prior to deposition, interface 9 is relatively pristine, metal film 5 is relatively pure and there is little mixing, spiking or diffusion between the silicon of silicon surface 3 and metal film 5. FIG. 4 also illustrates semiconductor substrate 1 resting on chuck 7. In one exemplary embodiment, chuck 7 may be a conventional chuck used in a system used to perform one of the aforementioned deposition operations.

In another exemplary embodiment, chuck 7 may be a temperature controlled electrostatic chuck, a so-called e-chuck used to control temperature during the deposition process. Chuck 7 is the pedestal or other member within the deposition chamber, that the semiconductor substrate 1 contacts when the deposition process occurs. According to the exemplary embodiment in which chuck 7 is a temperature controlled e-chuck, chuck 7 may maintain semiconductor substrate 1 and therefore silicon surface 3 at a temperature below the silicidation temperature required for the formation of nickel silicide. In one exemplary embodiment, the temperature may be at or below 100° C., and in another exemplary embodiment, the temperature may be between 50° C. and −50° C., e.g. the temperature may be maintained at 0° C. or lower, or it may be advantageously maintained at about −20° C. According to the embodiment in which chuck 7 is a cooling chuck, metal film 5 is formed as previously described.

There is substantially no diffusion, or silicide formation or nickel spiking because of the suppressed temperature produced in cooling semiconductor substrate 1 prior to deposition, cooling semiconductor substrate 1 during deposition, or both. Each of the metal layer and silicon surface is relatively unreacted and there is little diffusion. In one exemplary embodiment, the thickness of a mixed layer formed at interface 9 may be 20 Å or less. According to the embodiment in which a nickel alloy is formed, the distribution of the alloy additive is relatively uniform throughout the file due to the absence of nickel spiking.

Figure 5:
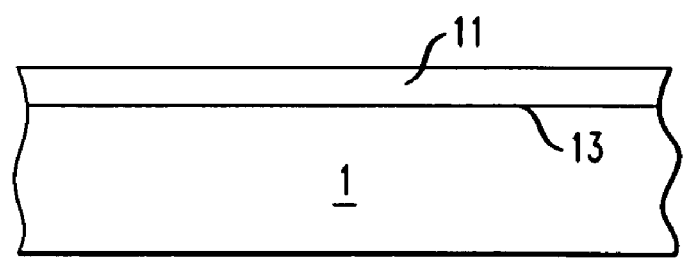

After deposition, a thermal annealing process is carried out to form the silicide and produce the structure illustrated in FIG. 5. In one exemplary embodiment, rapid thermal annealing, RTA, may be used. Various conditions may be used to elevate the temperature to a temperature at which silicidation occurs. In the case in which metal film 5 is a nickel film, a nickel silicide is formed. In the case in which metal film 5 is a composite of nickel and a further alloy additive X, as described above, a binary phase alloy Ni(X)Si is formed. FIG. 5 shows the formation of silicide film 11 on semiconductor substrate 1. Silicide film 11 may be advantageously formed to a depth between about 50-500 Å. The thickness of silicide layer 11 may be tailored or optimized by controlling the thickness of deposited metal layer 5 and the rapid thermal annealing or conventional annealing processing parameters, e.g., annealing time and temperature. In one embodiment, an RTA annealing time within the range of about 10 to 300 seconds may be used.

The silicide process is a phase transformation process. If the processing temperature is greater than the phase transformation temperature of a material, the original material phase changes to another phase. Different phases have different atomic arrangement and properties. For example, nickel's first phase transformation temperature is at about 200° C.-250° C. At a temperature above 200° C., nickel will begin to react with silicon to form $Ni_2Si$. Conversely, below this temperature, nickel silicidation will not occur. Another phase transformation temperature for nickel is about 300° C. At processing temperatures above 300° C., $Ni_2Si$ changes to NiSi. Therefore, temperatures above 300° C. may be used to form nickel silicide. The nickel silicide formation temperature may be lower for a patterned film. The addition of a further alloying element to the nickel target, such as the elements listed above, will cause a change in the silicidation temperature for the production of the binary phase alloy of Ni(X)Si. Depending on the element ("X"), the annealing temperatures and times for both conventional annealing and RTA, may be varied as determined by processing considerations. Various suitable annealing times may be used.

Still referring to FIG. 5, receded surface 13 is receded with respect to original silicon surface 3 due to the consumption of silicon as it reacts with the metal to form the silicide. Silicide film 11 includes improved thickness uniformity throughout semiconductor substrate 1 which may be a 6 to 12 inch wafer or larger. For a binary alloy, composition uniformity is improved across a wafer and wafer-to-wafer. $R_s$ variation is minimized across semiconductor substrate 1 and from wafer-to-wafer. The NiSi film may have a sheet resistivity, $R_s$ uniformity that varies no more than 1% to 3% across a wafer. Wafer-to-wafer average $R_s$ variation may be on the order of 1% to 2% but may vary in other exemplary embodiments.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as lower, upper, horizontal, vertical, above, below, up, down, top and bottom as well as derivatives thereof (e.g., horizontally, downwardly, upwardly, etc.) should be construed to refer to the orientation as then described or as shown in the drawing under discussion. These relative terms are for convenience of description and do not require that the apparatus be constructed or operated in a particular orientation. Terms concerning attachments, coupling and the like, such as connected and interconnected, refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:

providing a semiconductor substrate including at least a silicon surface;

heating to evaporate moisture from said silicon surface;

cooling said silicon surface to a temperature below a silicidation temperature required for nickel silicide formation, to produce a cooled silicon surface;

depositing nickel on said cooled silicon surface such that NiSi formation on said cooled silicon surface is suppressed during said depositing; and further heating to form a silicide film including at least Ni and Si and having an $R_6$ uniformity that varies by no more than about 1-3% across said silicide film.

2. The method as in claim 1, wherein said cooling said silicon surface comprises cooling to a temperature no greater than 100° C.

3. The method as in claim 1, wherein said further heating comprises rapid thermal annealing (RTA).

4. The method as in claim 1, wherein said depositing takes place with said semiconductor substrate on a cold chuck that maintains said semiconductor substrate at a temperature of less than 100° C.

5. The method as in claim 1 wherein said heating comprises degassing at a temperature within a range of 150 to 450° C. and for a time of about 10 to 60 seconds.

6. The method as in claim 1, wherein said depositing comprises one of sputtering, evaporation, PVD (physical vapor deposition), PECVD (plasma enhanced chemical vapor deposition), LPCVD (low pressure chemical vapor deposition) and atomic layer deposition (ALD).

7. The method as in claim 1, wherein said depositing precludes formation of a silicide layer having a thickness greater than 20 Å.

8. The method as in claim 1, wherein said depositing nickel comprises depositing a nickel alloy having a formula NiX on said cooled silicon surface, wherein X is an alloy additive selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf Ta, W, Re, Ir, Pt, Ce, Pr, Nd, Sm, Eu, Gd, Tb, Dy, Ho, Er, Tm, Yb, Lu, and mixtures thereof.

9. The method as in claim 8, wherein said depositing a nickel alloy comprises physical vapor deposition (PVD) from a target formed of said Ni and said alloy additive.

10. A method for forming a semiconductor device comprising:

providing a semiconductor substrate including at least a silicon surface;

heating to evaporate moisture from said silicon surface;

disposing said semiconductor substrate on a cold chuck in a deposition system and depositing nickel while said semiconductor substrate is disposed on said cold chuck, said cold chuck maintaining said semiconductor substrate at a temperature below a silicidation temperature required for formation of NiSi; and further heating to form a silicide film including at least Ni and Si and having an $R_s$ uniformity that varies by no more than about 1-3% across said silicide film.

11. The method as in claim 10, wherein said further heating comprises rapid thermal annealing (RTA).

12. The method as in claim 10, wherein said heating comprises degassing at a temperature within a range of 150 to 450° C. and for a time of about 10 to 60 seconds.

13. The method as in claim 10, wherein said cold chuck maintains said semiconductor substrate at a temperature within a range of about −50° C. to 50° C.

14. The method as in claim 10, wherein said chuck is an electrostatic chuck and further comprising controlling a temperature of said electrostatic chuck.

15. The method as in claim 10, further comprising cooling said semiconductor substrate to a temperature below 50° C. after said heating and prior to said disposing.

16. The method as in claim 10, wherein said depositing comprises one of sputtering, evaporation, PVD (physical vapor deposition), PECVD (plasma enhanced chemical vapor deposition), LPCVD (low pressure chemical vapor deposition) and atomic layer deposition (ALD).

17. The method as in claim 10, wherein said depositing precludes formation of a silicide layer having a thickness greater than 20 Å.

18. The method as in claim 10, wherein said depositing nickel comprises depositing a nickel alloy having a formula NiX on said cooled silicon surface, wherein X is an alloy additive selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu, and mixtures thereof.

19. The method as in claim 18, wherein said depositing a nickel alloy comprises physical vapor deposition (PVD) from a target formed of said Ni and said alloy additive.

20. A method for forming a semiconductor device comprising:

providing a semiconductor substrate including at least a silicon surface;

heating to evaporate moisture from said silicon surface;

disposing said semiconductor substrate on a cold chuck in a deposition system and depositing nickel while said semiconductor substrate is disposed on said cold chuck, said cold chuck maintaining said semiconductor substrate at a temperature below a silicidation temperature required for formation of NiSi; and further heating to form a silicide being a NiSi film having an $R_s$ uniformity that varies by no more than about 1-3% across said NiSi film.

\* \* \* \* \*

UNITED STATES PATENT AND TRADEMARK OFFICE
CERTIFICATE OF CORRECTION

PATENT NO. : 7,446,042 B2
APPLICATION NO. : 11/343648
DATED : November 4, 2008
INVENTOR(S) : Chii-Ming Wu et al.

It is certified that error appears in the above-identified patent and that said Letters Patent is hereby corrected as shown below:

Column 4, line 10, replace "200° C." with --200 °C--
Column 4, line 12, replace "150° C." with --150 °C--
Column 4, line 12, replace "450° C." with --450 °C--
Column 4, line 12, replace "180° C." with --180 °C--
Column 4, line 12, replace "220° C." with --220 °C--
Column 4, line 22, replace "100° C." with --100 °C--
Column 4, line 24, replace "0° C." with --0 °C--
Column 4, line 24, replace "50° C." with --50 °C--
Column 4, line 25, replace "-50° C." with -- -50 °C--
Column 4, line 25, replace "0° C." with --0 °C--
Column 5, line 17, replace "100° C." with --100 °C--
Column 5, line 18, replace "50° C." with --50 °C--
Column 5, line 18, replace "-50° C." with -- -50 °C--
Column 5, line 19, replace "0° C." with --0 °C--
Column 5, line 20, replace "-20° C" with -- -20 °C--
Column 5, lines 57-58, replace "200° C.-250° C" with --200 °C - 250 °C--
Column 5, line 58, replace "200° C." with --200 °C--
Column 5, line 61, replace "300° C" with --300 °C--
Column 5, line 62, replace "300° C" with --300 °C--
Column 5, line 63, replace "300° C." with --300 °C--
Column 7, line 12, claim 2, replace "100° C" with --100 °C--
Column 7, line 18, claim 4, replace "100° C" with --100 °C--
Column 7, line 20, claim 5, replace "450° C." with --450 °C--
Column 8, line 8, claim 12, replace "450° C." with --450 °C--
Column 8, line 11, claim 13, replace "-50° C. to 50° C" with -- -50 °C to 50 °C--

UNITED STATES PATENT AND TRADEMARK OFFICE
CERTIFICATE OF CORRECTION

PATENT NO. : 7,446,042 B2
APPLICATION NO. : 11/343648
DATED : November 4, 2008
INVENTOR(S) : Chii-Ming Wu et al.

It is certified that error appears in the above-identified patent and that said Letters Patent is hereby corrected as shown below:

Column 8, line 16, claim 15, replace "50° C." with --50 °C--

Signed and Sealed this

Twenty-eighth Day of April, 2009

JOHN DOLL
*Acting Director of the United States Patent and Trademark Office*